United States Patent [19]

Yarman

[11] Patent Number: 4,630,010
[45] Date of Patent: Dec. 16, 1986

[54] LOW PASS T-SECTION DIGITAL PHASE SHIFTER APPARATUS

[75] Inventor: Binboga S. Yarman, Çengelköy/İstanbul, Turkey

[73] Assignee: The United States of America as represented by the Secretary of the Air Force, Washington, D.C.

[21] Appl. No.: 767,578

[22] Filed: Aug. 20, 1985

[51] Int. Cl.$^4$ .............................................. H03H 7/20
[52] U.S. Cl. .................................... 333/139; 333/138; 333/164
[58] Field of Search ................................ 333/138–140, 333/156, 164, 23, 161, 28 R; 332/30 R, 30 V; 307/320

[56] References Cited

U.S. PATENT DOCUMENTS

| | | | |
|---|---|---|---|
| 2,585,841 | 2/1952 | Richardson | 333/139 |
| 2,585,842 | 2/1952 | Richardson | 333/139 |
| 3,718,873 | 2/1973 | Garver | 333/164 |
| 3,748,499 | 7/1973 | Schaffner | 333/140 X |
| 3,778,733 | 12/1973 | Rizzi | 333/139 |
| 4,275,367 | 6/1981 | Gaglione et al. | 333/164 |

OTHER PUBLICATIONS

Ghirardi—"Radio Physics Course", Radio and Technical Publishing Co., New York City, 1937; pp. 216–217.
"Broad-Band Diode Phase Shifters," by R. V. Garver, in IEEE Transactions on Microwave Theory and Techniques, vol. MTT-20, No. 5, May 1972, pp. 314–323.
"Simplified Switched Line Phase Shifter," by A. Schwarzmann, in DEP Symposium on MIC's, May 1971.

Primary Examiner—Marvin L. Nussbaum
Attorney, Agent, or Firm—William Stepanishen; Donald J. Singer

[57] ABSTRACT

A low pass T-section digital phase shifter apparatus having a pair of serially connected inductor-diode combinations connected in series which includes a parallel circuit connected between the common junction and ground. The parallel circuit has an inductor in parallel with a series capacitor and diode to provide a balanced insertion loss at each diode switching state. When the diodes are in the forward-biased state they act as closed short circuit switches. When the diodes are reversed-biased, the inductance in the series circuit resonates with the diode capacitance to provide a short path to the RF signal to pass the center frequency of the RF signal at the desired phase.

2 Claims, 4 Drawing Figures

LOW PASS T-SECTION DIGITAL PHASE SHIFTER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a phase shifter apparatus, and in particular to a low pass T-section digital phase shifter apparatus.

In the prior art, many electronic devices such as, for example, phased array systems utilize fundamental phase shifting circuits to achieve important functions. According to well-known prior art designs, phase shifters devices have generally required the use of circuits which employed a number of inductive elements. These prior art discrete element circuits are expensive since they must be built up element by element and to this date, it was not possible to implement an inductor into a monolithic or similar type circuit. In addition, the inductors which are rather expensive, add to the overall circuit cost.

Other prior art phase shifters have been developed to utilize digital techniques in obtaining the phase shift. However, the digital phase shifters in general are even more expensive than the discrete element inductive phase circuits, but they do have the distinct advantage of being mathematically predictable and are susceptible to monolithic implementation as well as batch processing.

At present, it is clear that none of the prior art phase shifters are able to satisfy the dual requirements of economy and small size. Therefore, it would be particularly desireable if such a circuit could be developed, particularly if such a circuit would be susceptible to a monolithic implementation capable such that it would be capable of being produced at low cost in large quantities.

In the military market, there is an increasing demand to design low loss phase shifters at especially extra high frequencies (EHF). The circuit losses are basically due to switching elements as well as mismatch and passive circuit components. Losses may be reduced by choosing the monolithic approach since it provides compact size which in turn reduces the passive component losses. On the other hand, in many of the conventional design techniques, the mismatch losses are intrinsic to the design and they may not be suitable for monolithic realizations. In the academic environment while the study continues on the low-loss switching devices, different phase shifter circuit configurations which are suitable for monolithic implementation are also searched extensively.

In the prior art, there are new digital phase shifter configurations which are based upon the operation of high-pass L-C ladders as phase shifting units. These circuits provide relatively better phase shifting performance over the other conventional circuits. In the present invention, a complementary low pass L-C ladder T-section digital phase shifter which has outstanding phase shifting characteristics over the prior art highpass T-section phase shifter is presented. Furthermore, the inductances utilized in the low pass phase shifter apparatus provide practical flexibility to make the circuit interconnections. Therefore, the new low pass T-section phase shifter apparatus will find wide application in the system design where conventional and other new approaches are not feasible to use.

In addition, the present invention is arranged in the form of a T-section digital phase shifter which has better insertion loss characteristics with improved phase tracking capability over the normal conventional approaches.

SUMMARY OF THE INVENTION

The present invention utilizes a parallel resonant circuit which is comprised an inductor in parallel with a capacitor that is in series with a diode. The resonant parallel circuit is arranged in a T configuration at the common junction between the series circuit which comprises an inductor in series with a diode. The T-section digital phase shifter apparatus exhibits easy practical implementation with balanced insertion loss at each diode switching state. Therefore, it will find wide application in the military communication, system design.

It is one object of the present invention, therefore, to provide an improved low pass T-section digital phase shifter apparatus.

It is another object of the invention to provide an improved low pass T-section digital phase shifter apparatus wherein the resonant circuit comprises an inductor in parallel with a capacitor which is in series with a diode.

It is yet another object of the invention to provide an improved low pass T-section digital phase shifter apparatus wherein the parallel combination of an inductor and a capacitor in series with a diode is arranged between the common junction of the series inductor/diode combination to ground.

It is still another object of the invention to provide an improved low pass T-section digital phase shifter apparatus wherein the insertion loss of the phase shift circuit is balance for each diode conducting state.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
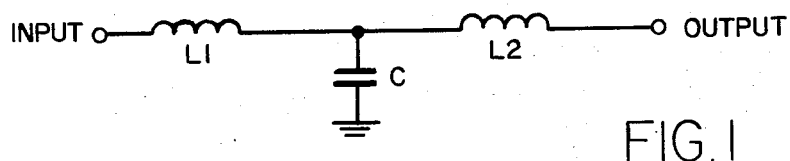
FIG. 1 is a schematic diagram of a prior art low pass L-C T-section phase shift circuit.

Turning now to FIG. 1, there is shown a schematic diagram of a prior art low pass L-C T-section phase shift circuit. The low pass L-C T-section phase shift circuit is a relatively simple circuit which comprises three circuit elements in the form of a T circuit utilizing two inductors, L and a capacitors, C. As shown in FIG. 1, the low pass L-C T-section phase shift circuit comprises a pair of inductors, L1 and L2 which are serially connected between the input and the output of the phase shift circuit. A capacitor, C is connected from the common junction between the two inductors L1, L2 to ground to form the low pass L-C T-section configuration.

The low pass T-section digital phase shifter apparatus which is shown in FIG. 1, will have the element values of a symmetric low pass T-section computed in such a way that, at the design center frequency $f_o$, a desired phase shift $\phi_s$ is achieved with zero insertion loss.

Thus, the inductances L1, L2 and the capacitor C are defined as a function of phase shift $\phi_s$ as follows:

$$\eta = \tan\left(\frac{\pi}{2} - \phi_s\right) \qquad (1)$$

$$L = \frac{1}{\eta + \sqrt{\eta^2 + 1}} \qquad (2)$$

$$C = 2L/(1 + L^2) \qquad (3)$$

where $\phi_s$ is the desired phase shift and the capacitor C and the inductances L are all normalized with respect to center frequency $f_o$ and the termination resistance $R_o$ which is not shown ($R_o$ possibly chosen at 50 Ω). It should be noted that in equation (3) the value of inductor L is equal to inductor L1 which is equal to inductor L2. It should be observed from equation (1) that a phase shift between 0° and 180° is possible, that is:

$$0 < \phi_s 180°$$

Figure 2:
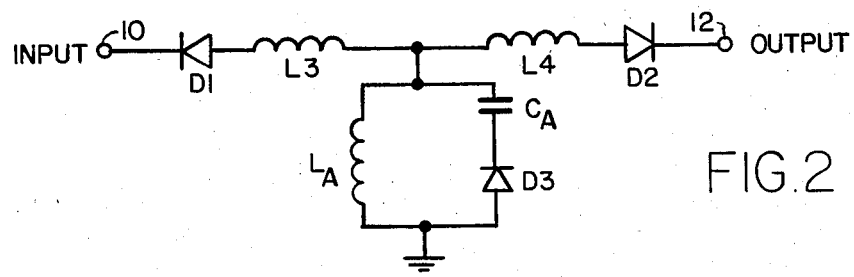
FIG. 2 is a schematic diagram of the low pass T-section digital phase shifter apparatus according to the present invention.

Referring now to FIG. 2, there is shown a schematic diagram of the low pass T-section digital phase shifter apparatus according to a preferred embodiment of the present invention. The low pass T-section digital phase shifter apparatus comprises a series combination of an inductor L3 and a diode D1, and inductor L4 and diode d2 which are connected between the input 10 and the output 12 of the digital phase shift circuit. A parallel circuit which comprises an inductor $L_A$ in parallel with the series combination of capacitor $C_A$ and diode D3, is connected between the common junction of the series inductor/diode combination (inductor L3/diode D1 and inductor L4/diode D2) and ground. The operation of the low pass T-section digital phase shifter apparatus is basically the same as the phase shifting operation of the prior art low pass T-section which was described with respect to FIG. 1. For all practical considerations, all the diodes D1 through D3 of the digital phase shifter apparatus are assumed to be identical. This practical restriction can easily be removed considering the particular desired characteristics of the phase shifting operation.

Figure 3:
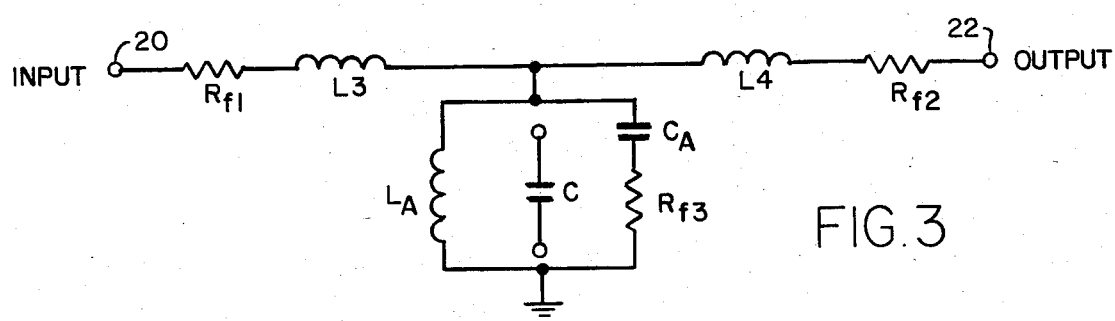
FIG. 3 is a schematic diagram of the low pass T-section digital phase shifter apparatus in which the diodes are forward-biased.
Figure 4:
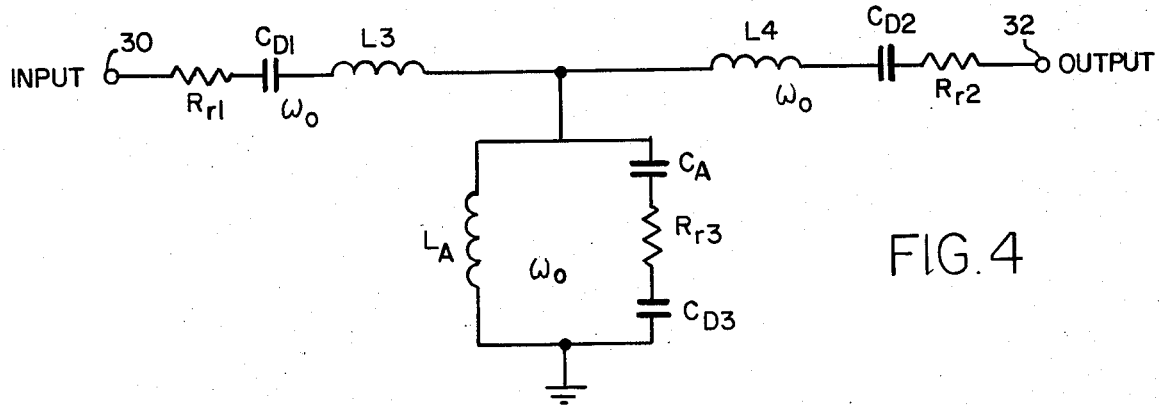
FIG. 4 is a schematic diagram of the low pass T-section digital phase shifter apparatus in which the diodes are reversed-biased.

The operation of the low pass T-section digital phase shifter apparatus will be better understood when the following description is taken in conjunction with FIGS. 3 and 4. In FIG. 3 there is shown a schematic diagram of the low pass T-section digital phase shifter apparatus in which the diodes D1 through D3 of FIG. 2 are forward-biased (BIT-IN-State). When the diode D1 is forward-biased, the series circuit from the input 20 to the output 22 comprises the inductor L1 and the forward resistance, $R_f$ of the diode D1 in series with the inductor L4 and the forward resistance $R_{f2}$ of the diode D2.

When the diodes D1 through D3 are forward-biased, they act as short circuits. In this case, pure inductance L which is defined by equation (2) will be seen on the series arms. In the shunt branch, parallel inductance $L_A$ together with capacitor $C_A$ approximates the capacitor value given by equation (3) at the center frequency $f_o$. Hence the low pass T-operation which was described in the foregoing discussion is simulated. In the forward-biased state (BIT-IN) the ideal switch characteristic of the diodes D1 through D3 will be perturbed with the forward diode resistance $R_f$. However, for a good switching diodes, the effect of resistance $R_f$ is negligible.

In FIG. 4, the diodes D1 through D3 are reversed-biased and the equivalent schematic diagram of the low pass T-section digital phase shifter apparatus is therein shown. When the diodes D1, D2 are reversed-biased (BIT-OUT-State), the series circuit from the input 30 to the output 32 comprises the inductors L3, L4 in series with the reversed-biased equivalents of the diodes D1, D2 which are respectively resistances $R_{r1}$, $R_{r2}$ and the capacitors $C_{D1}$, $C_{D2}$. In the reverse-biased mode, the shunt circuit branch reduces to the parallel combination of the inductor $L_A$ with the series elements of capacitor $C_A$, resistor $R_{r3}$ and capacitor $C_{D3}$. When the diode D3 is reverse-biased, it reduces to its equivalent circuit element of a resistor $R_{r3}$ in series with a capacitor $C_{D3}$. For example, the original branch series circuit of FIG. 2 which was comprised of capacitor $C_A$ and diode D3, reduces to the series combination of the capacitor $C_A$, resistor $R_{r3}$ and capacitor $C_{D3}$ when the diode D3 is reverse-biased.

When the diodes D1 and D2 are reverse-biased (BIT-OUT State), the reversed diode capacitance $C_D$ for each reverse-biased diode D1, D2 respectively, is chosen to resonate with L (where L is equal to L1 and, L1 is equal to L2) so that an equivalent short circuit paths are seen on the series arms at the center frequency, $f_o$. Furthermore, the value of the capacitance, $C_D$ is defined as follows:

$$C_D = \frac{I}{L} \qquad (4)$$

In the shunt circuit branch, the inductance $L_A$ also resonates with equivalent capacitor $$C_T = \frac{C_A C_D}{C_A + C_D}$$

at the center frequency $f_o$, providing an open switch to the Rf signal. In this case, the value of the lumped capacitor $C_A$ is given by:

$$C_A = \frac{C + \sqrt{C^2 + 4CC_D}}{2} \qquad (5)$$

and the shunt inductance $L_A$ is defined as:

$$L_A = \frac{1}{C_A - C} \qquad (6)$$

Thus, the design equations of the present low loss T-section digital phase shifter are completely definitive for a practical application.

It should be noted that the ideal reverse biased operation of the diodes D1 through D3 will be perturbed by a small resistance $R_r$. However, it is anticipated that for a good switching diode, the resistance $R_r$ will equal resistance $R_f$ and both resistances will be small enough so as not to effect the switching operation. If the discrete element approach is taken, the series inductances L1, L2 can easily be implemented in a manner to facilitate the back to back diode connections. The inductors can be realized as bond wires, gold ribbons or approximated by transmission lines.

The tuning capacitor $C_A$ could be any kind of chipped-lumped ceramic capacitor. If the monolithic approach is taken, various kinds of substrates (e.g. Si, GaAs, GaInAs, InP, etc.) can be used to realize the diodes and the rest of the circuit components. The series diodes may preferably be realized as planar or mesa-pin diodes. The shunt diode can be implented as Pin-diode, using the available and well-known conventional device technology. The lumped capacitor may be fabricated as a layer capacitor, while inductors L and $L_A$ can either be printed on the substrate or approximated by transmission lines depending on the design frequency. The DC biasing is the present apparatus conventional.

Although the invention has been described with reference to a particular embodiment, it will be understood to those skilled in the art that the invention is capable of a variety of alternative embodiments within the spirit and scope of the appended claims.

What is claimed is:

1. A low pass T-section digital phase shifter apparatus comprising in combination:
   a first inductor means serially connected to a first diode means, the anode of said first diode means connected to one end of said first inductor means, the cathode of said first diode means forming an input terminal for an input signal, said first diode means having a first and second state,
   a second inductor means serially connected to a second diode means, the anode of said second diode means connected to one end of said second inductor means, the cathode of said second diode means forming an output terminal, the other end of said first and second inductor means being connected to each other to form a first common junction, said second diode means having a first and second state, and
   a shunt circuit comprising a third inductor means in parallel with first capacitor means which is in series with a third diode means, one end of said third inductor means connected to one end of said first capacitor means to form a first junction, said first junction connected to said common junction between said first and second inductor means, the other end of said third inductor means connected to one end of said third diode means to form a second junction, said second junction connected to ground, said third diode means having a first and second state, said first, second and third diodes means are identical, said first state of said first, second and third diode means is the forward-biased state and said second state of said first, second and third diode means is the reverse-biased state, said first, second and third diode means in said second state each respectively comprise a capacitance, $C_D$ and a reverse resistance, $R_r$, and when said first, second and third diode means are in said second state said first and second inductor means respectively resonates with said first and second diode means capacitance, $C_D$ to provide a short circuit path to an input RF signal, said first and second diode means capacitance, $C_D$ is defined according to the following equation:

$$C_D = \frac{1}{L};$$

where L is the inductance of said first and second inductor means.

2. A low pass T-section digital phase shifter apparatus as described in claim 1 wherein said shunt circuit resonates according to the equation:

$$C_T = \frac{C_A C_D}{C_A + C_D}$$

where $C_T$ is the total capacitance of the series capacitance path which is in parallel with said third inductor means respectively, and $C_A$ is the capacitance value of said third capacitor means and $C_D$ is the value of said third diode means capacitance, $C_D$.

* * * * *